United States Patent
Iyer et al.

(10) Patent No.: US 9,390,212 B2
(45) Date of Patent: Jul. 12, 2016

(54) METHODS AND APPARATUS FOR SYNTHESIZING MULTI-PORT MEMORY CIRCUITS

(71) Applicant: Cisco Technology, Inc., San Jose, CA (US)

(72) Inventors: Sundar Iyer, Palo Alto, CA (US);
Shang-Tse Chuang, Los Altos, CA (US); Thu Nguyen, Palo Alto, CA (US);
Sanjeev Joshi, San Jose, CA (US);
Adam Kablanian, Los Altos Hills, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/702,971

(22) Filed: May 4, 2015

(65) Prior Publication Data
US 2015/0234950 A1   Aug. 20, 2015

Related U.S. Application Data

(63) Continuation of application No. 13/434,296, filed on Mar. 29, 2012, now Pat. No. 9,058,860.

(51) Int. Cl.
*G11C 11/00* (2006.01)
*G06F 17/50* (2006.01)
*G11C 11/419* (2006.01)

(52) U.S. Cl.
CPC .......... *G06F 17/505* (2013.01); *G06F 17/5072* (2013.01); *G11C 11/419* (2013.01)

(58) Field of Classification Search
CPC . G06F 17/505; G06F 17/5072; G11C 11/419; G11C 7/1075; G11C 11/413
USPC .............. 365/154, 230.05, 189.05, 189.06
See application file for complete search history.

(56) References Cited

U.S. PATENT DOCUMENTS

| | | |
|---|---|---|
| 5,089,992 A | 2/1992 | Shinohara |
| 5,260,908 A | 11/1993 | Ueno |
| 5,473,574 A | 12/1995 | Clemen et al. |
| 5,535,159 A | 7/1996 | Nii |
| 5,793,669 A | 8/1998 | Sheffield et al. |
| 5,912,850 A | 6/1999 | Wood et al. |
| 5,914,906 A | 6/1999 | Iadanza et al. |
| 5,959,931 A | 9/1999 | Ueda |
| 6,005,796 A | 12/1999 | Sywyk et al. |
| 6,288,969 B1 | 9/2001 | Gibbins et al. |
| 6,378,065 B1 | 4/2002 | Arnold et al. |
| 6,447,465 B1 | 9/2002 | Sherman et al. |

(Continued)

*Primary Examiner* — Viet Q Nguyen
(74) *Attorney, Agent, or Firm* — Edell, Shapiro & Finnan, LLC

(57) ABSTRACT

Multi-port memory circuits are often required within modern digital integrated circuits to store data. Multi-port memory circuits allow multiple memory users to access the same memory cell simultaneously. Multi-port memory circuits are generally custom-designed in order to obtain the best performance or synthesized with logic synthesis tools for quick design. However, these two options for creating multi-port memory give integrated circuit designers a stark choice: invest a large amount of time and money to custom design an efficient multi-port memory system or allow logic synthesis tools to inefficiently create multi-port memory. An intermediate solution is disclosed that allows an efficient multi-port memory array to be created largely using standard circuit cell components and register transfer level hardware design language code.

15 Claims, 13 Drawing Sheets

(56) References Cited

U.S. PATENT DOCUMENTS

| | | | | |
|---|---|---|---|---|
| 6,470,475 B2* | 10/2002 | Dubey | | G11C 11/41 |
| | | | | 716/121 |
| 6,765,408 B2 | 7/2004 | Cheng et al. | | |
| 6,966,044 B2* | 11/2005 | Reuland | | G06F 17/5045 |
| | | | | 716/117 |
| 6,990,025 B2 | 1/2006 | Kirihata et al. | | |
| 7,050,324 B2 | 5/2006 | Cummings et al. | | |
| 7,224,635 B2 | 5/2007 | Lambrache et al. | | |
| 7,236,525 B2* | 6/2007 | Pearson | | G04N 19/423 |
| | | | | 375/240.12 |
| 7,254,088 B2 | 8/2007 | Kurumada et al. | | |
| 7,257,799 B2* | 8/2007 | McKenney | | G06F 17/5045 |
| | | | | 716/117 |
| 7,310,787 B2* | 12/2007 | Prakash | | G06F 17/5045 |
| | | | | 707/999.001 |
| 7,359,275 B1 | 4/2008 | Wu | | |
| 7,386,833 B2* | 6/2008 | Granny | | G06F 17/5027 |
| | | | | 717/109 |
| 7,587,697 B1* | 9/2009 | Schmit | | G06F 17/5054 |
| | | | | 716/138 |
| 7,672,188 B2 | 3/2010 | Correale et al. | | |
| 7,930,666 B1* | 4/2011 | Schmit | | G11C 8/16 |
| | | | | 703/14 |
| 8,161,249 B1* | 4/2012 | Elkins | | H03K 19/17736 |
| | | | | 326/38 |
| 8,284,593 B2 | 10/2012 | Russell et al. | | |
| 8,631,365 B2 | 1/2014 | Kengeri et al. | | |
| 8,760,958 B2* | 6/2014 | Iyer | | G11C 11/412 |
| | | | | 365/154 |
| 9,058,860 B2* | 6/2015 | Iyer | | G11C 11/412 |
| 2009/0172621 A1* | 7/2009 | Sathe | | G06F 17/5045 |
| | | | | 716/113 |
| 2010/0122105 A1* | 5/2010 | Arslan | | G06F 15/7867 |
| | | | | 713/500 |

* cited by examiner

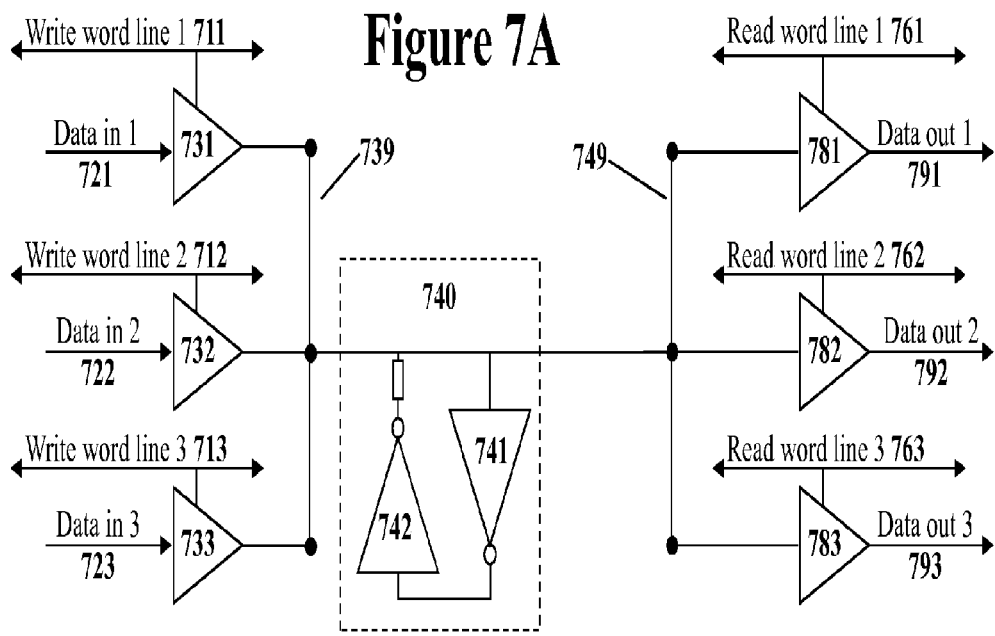
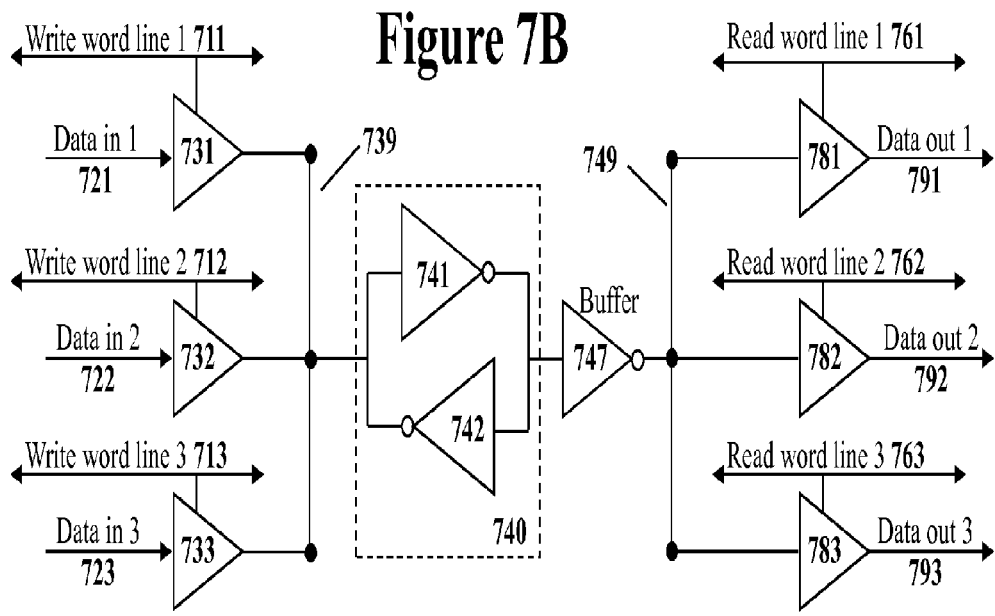

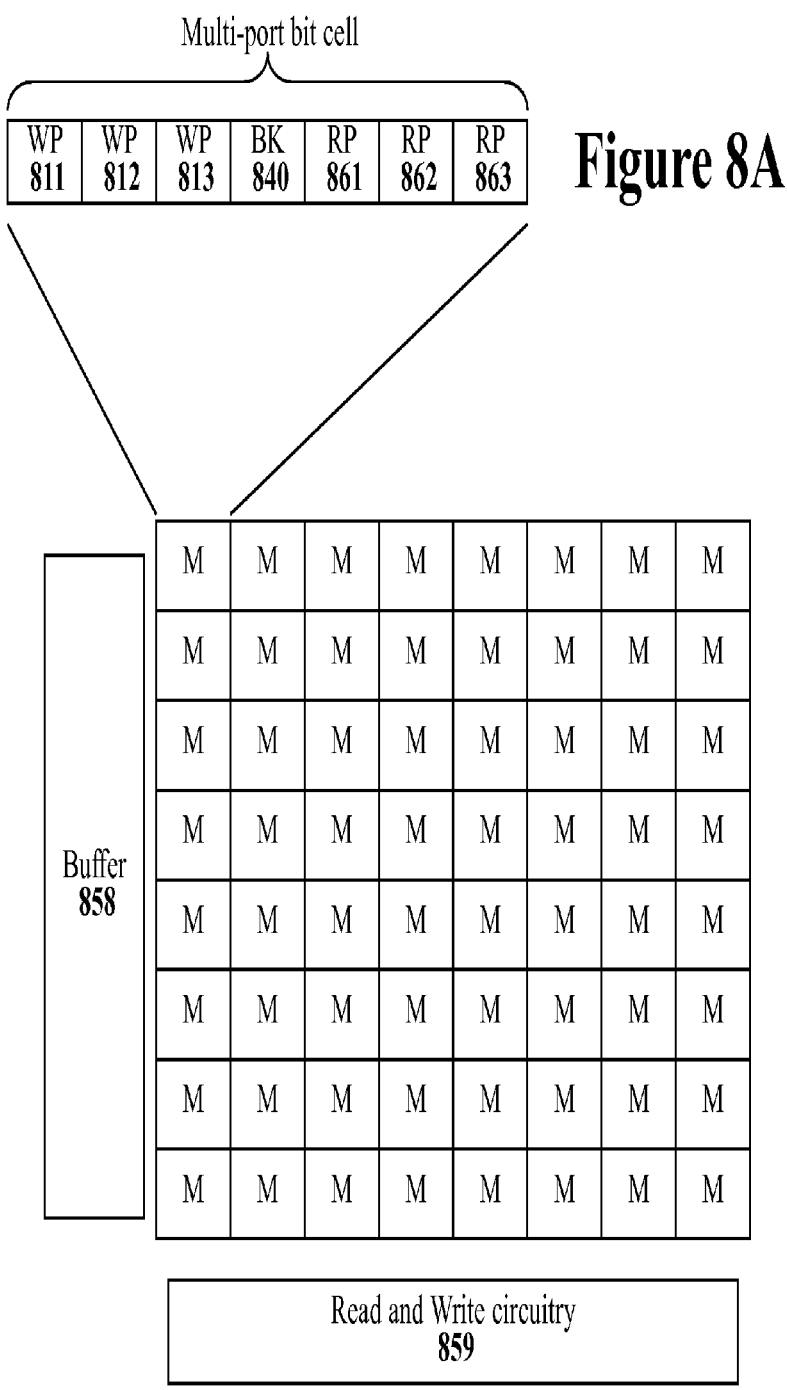

METHODS AND APPARATUS FOR SYNTHESIZING MULTI-PORT MEMORY CIRCUITS

CROSS REFERENCE TO RELATED APPLICATION

This application is a continuation of U.S. Non-Provisional application Ser. No. 13/434,296, filed Mar. 29, 2012, still pending, entitled "Methods And Apparatus For Synthesizing Multi-Port Memory Circuits", the contents of which are incorporated in their entirety herein by reference.

TECHNICAL FIELD

The present invention relates to the field of digital memory circuits. In particular, but not by way of limitation, the present invention discloses techniques for designing, synthesizing, and manufacturing multi-port memory circuits for use within integrated circuits.

BACKGROUND

Most memory circuits are "single port" memory circuits that can only be read from or written to by a single memory using entity. For example, the standard six-transistor (6T) static random access memory (SRAM) cell only has a single memory port such that only one read operation or one write operation can be handled at a time. For many applications it is desirable to have "multi-port" memory systems where more than one memory using entity may concurrently access the same memory cell. For example, in a multi-core processor system it is advantageous to allow multiple processor cores to be able access the contents of the same memory address concurrently. Allowing concurrent access prevents processing "stalls" wherein a processor core must wait for another memory access operation to complete before that processor core can access data from the desired memory location.

To allow two (or more) concurrent memory access operations, the fundamental memory cell circuitry may be altered to include additional physical memory port circuits. For example, the standard single-port 6T SRAM cell may be transformed into a two-port memory cell by adding two more transistors that provide a second port for accessing the memory cell. With a second memory port, two different memory using entities can read from the same 8T SRAM cell at the same time.

Adding two additional transistors to implement a second port increases the physical size of the memory cell circuit. Furthermore, due to the risk of losing memory bit stored in the SRAM memory cell, certain transistors in the two port 8T SRAM cell must be made much larger thus further increasing the size of the two port 8T SRAM cell. Thus, adding a second memory port can significantly reduce the memory density (memory bits per integrated circuit area) of the memory system. In addition to increased circuit size, multi-port memory cells will consume more power.

To create the most efficient multi-port memory systems in terms of memory density, performance, and power consumption, integrated circuit designers must often resort to designing custom multi-port memory arrays. Designing a custom multi-port memory system is very costly and time consuming process. The only alternative is to allow synthesis tools to create multi-port memory as needed but the multi-port memory created by synthesis tools tends to be very inefficient. Therefore, it would be desirable to have alternative multi-port memory cell designs and systems for creating multi-port memory.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 7A illustrates a first embodiment of a multi-port memory cell circuit that may be created using a standard bus keeper circuit as the core memory element.

FIG. 7B illustrates a second embodiment of a multi-port memory cell circuit that may be created using a bus keeper circuit and an additional buffer.

FIG. 8A illustrates a block diagram of a multi-port memory cell constructed from standard circuit cells.

FIG. 8B illustrates a block diagram of a multi-port memory array constructed from the multi-port memory cell of FIG. 8A.

DETAILED DESCRIPTION

The following detailed description includes references to the accompanying drawings, which form a part of the detailed description. The drawings show illustrations in accordance with example embodiments. These embodiments, which are also referred to herein as "examples," are described in enough detail to enable those skilled in the art to practice the invention. It will be apparent to one skilled in the art that specific details in the example embodiments are not required in order to practice the present invention. For example, although some of the example embodiments are disclosed with reference to computer processing systems used for packet-switched networks, the teachings can be used in many other environments. Thus, any digital system that uses digital memory can benefit from the teachings of the present disclosure. The example embodiments may be combined, other embodiments may be utilized, or structural, logical and electrical changes may be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Computer Systems

Figure 1:
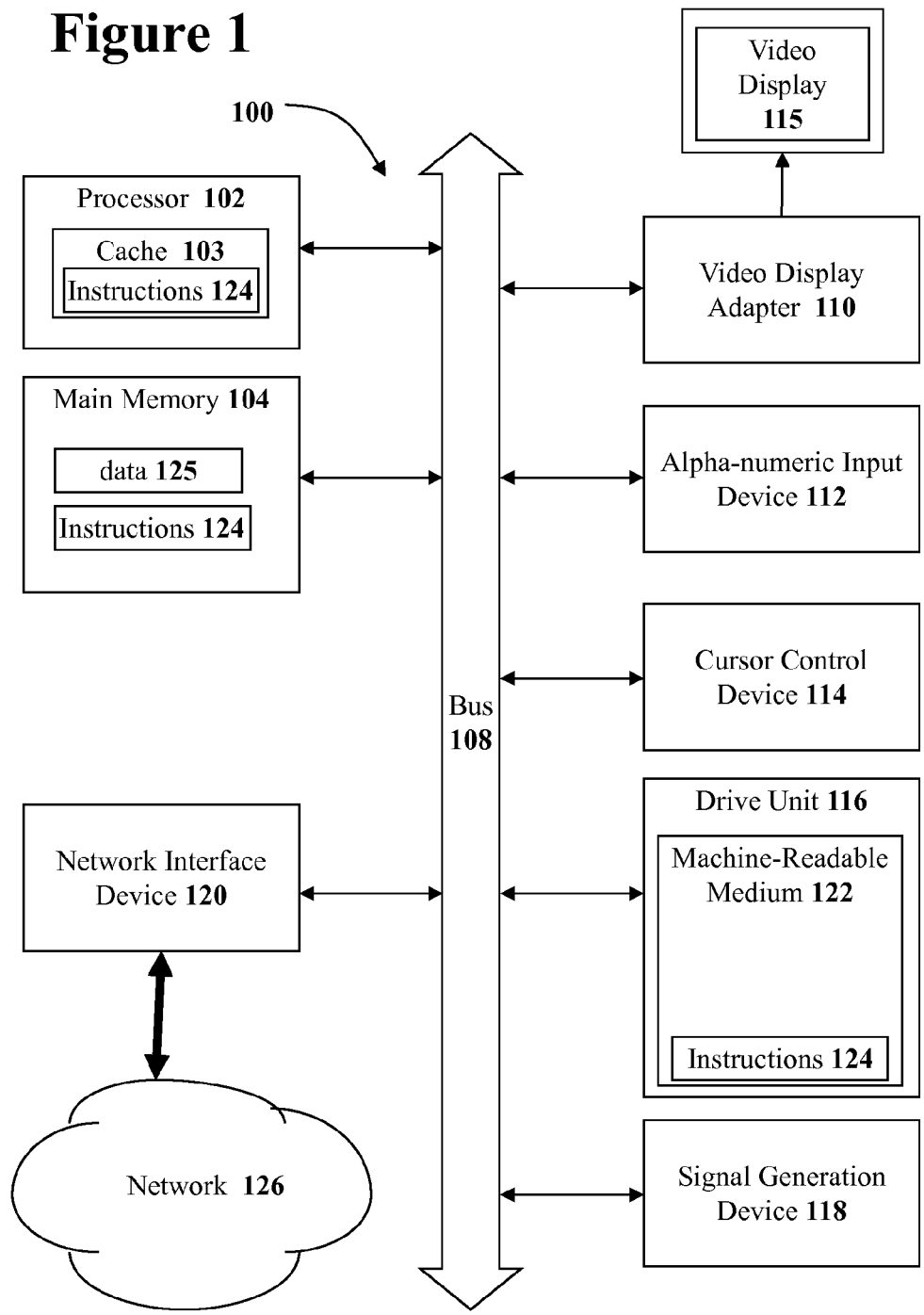
FIG. 1 illustrates a computer system within which a set of instructions, for causing the machine to perform any one or more of the methodologies discussed herein, may be executed.

The present disclosure concerns digital memory devices that are often used in computer systems and other digital electronics. FIG. 1 illustrates a diagrammatic representation of a machine in the example form of a computer system 100 that may be used to implement portions of the present disclosure (such as the design techniques) and may be an end-user of the synthesized multi-port memory circuits. Within computer system 100 of FIG. 1, there are a set of instructions 124 that may be executed for causing the machine to perform any one or more of the methodologies discussed within this document. Furthermore, while only a single computer is illustrated, the term "computer" shall also be taken to include any collection of machines that individually or jointly execute a set (or multiple sets) of instructions to perform any one or more of the methodologies discussed herein.

The example computer system 100 of FIG. 1 includes a processor 102 (e.g., a central processing unit (CPU), a graphics processing unit (GPU) or both) and a main memory 104 and a static memory 106, which communicate with each other via a bus 108. The computer system 100 may further include a video display adapter 110 that drives a video display system 115 such as a Liquid Crystal Display (LCD). The computer system 100 also includes an alphanumeric input device 112 (e.g., a keyboard), a cursor control device 114 (e.g., a mouse or trackball), a disk drive unit 116, a signal generation device 118 (e.g., a speaker) and a network interface device 120. Note that not all of these parts illustrated in FIG. 1 will be present in all embodiments. For example, a computer server system may not have a video display adapter 110 or video display system 115 if that server is controlled through the network interface device 120.

The disk drive unit 116 includes a machine-readable medium 122 on which is stored one or more sets of computer instructions and data structures (e.g., instructions 124 also known as 'software') embodying or utilized by any one or more of the methodologies or functions described herein. The instructions 124 may also reside, completely or at least partially, within the main memory 104 and/or within a cache memory 103 associated with the processor 102. The main memory 104 and the cache memory 103 associated with the processor 102 also constitute machine-readable media.

The instructions 124 may further be transmitted or received over a computer network 126 via the network interface device 120. Such transmissions may occur utilizing any one of a number of well-known transfer protocols such as the well-known File Transport Protocol (FTP). While the machine-readable medium 122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies described herein, or that is capable of storing, encoding or carrying data structures utilized by or associated with such a set of instructions. The term "machine-readable medium" shall accordingly be taken to include, but not be limited to, solid-state memories, optical media, and magnetic media.

For the purposes of this specification, the term "module" includes an identifiable portion of code, computational or executable instructions, data, or computational object to achieve a particular function, operation, processing, or procedure. A module need not be implemented in software; a module may be implemented in software, hardware/circuitry, or a combination of software and hardware.

Multi-Port Memory Overview

When designing a modern digital integrated circuit many designers will encounter the need for multi-port memory. Multi-port memory systems allow multiple different circuit entities to concurrently access the same memory location in a memory system.

For example, a processor system may use multi-port memories to implement register files for the processor. A register file is an array of multi-port memory cells that store the data values of the processor's architectural registers. Register files typically have dedicated read ports and write ports to each memory location, whereas ordinary single-port or dual-port SRAM cells will usually read and write through the same ports.

Figure 2:
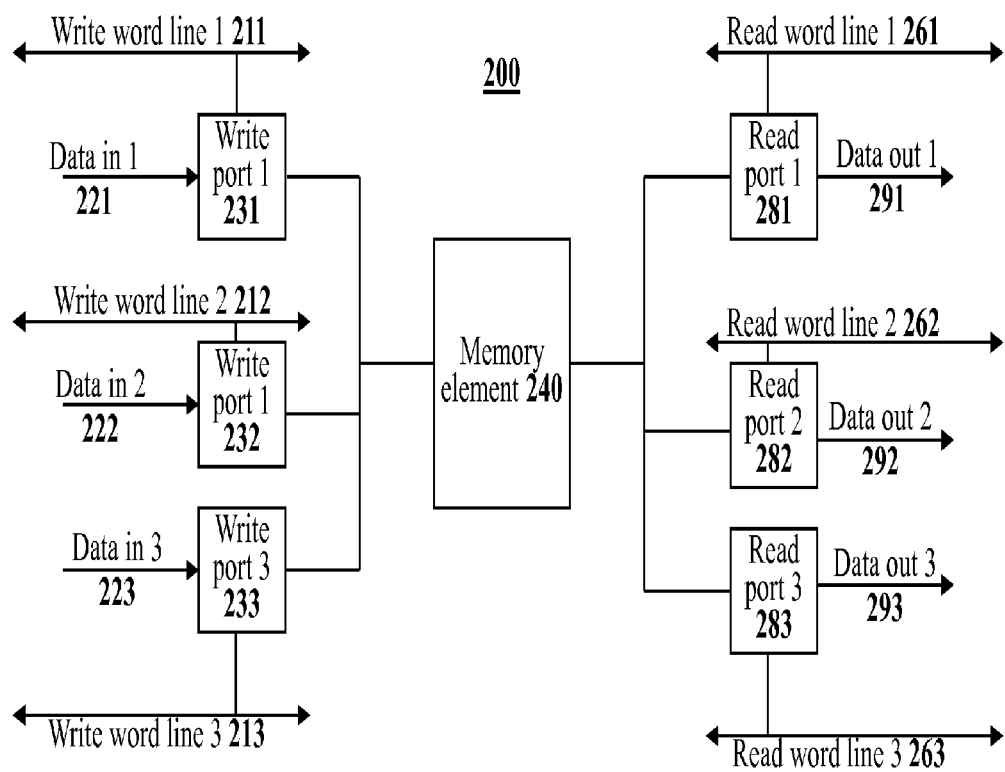
FIG. 2 conceptually illustrates a block diagram of an example multi-port memory cell.

FIG. 2 conceptually illustrates a block diagram of an example multi-port memory bit cell 200. A memory element 240 at the center of the multi-port memory cell 200 used to store a bit of data in multi-port memory bit cell 200. Various different types of memory circuits may be used to implement the memory element 240 within a multi-port memory cell.

Multi-port memory cells may various different numbers of read-ports and write ports. The specific multi-port memory bit cell 200 of FIG. 2 is a three read-port and three write-port memory bit cell. Thus, multi-port memory cell 200 has three data input lines 221, 222, and 223. The data input lines are commonly referred to as write bit lines. Each data input line (221, 222, and 223) has a write port (231, 232, and 233) that is controlled by an associated word line (211, 212, and 213). The multi-port memory bit cell 200 also has three data output lines (291, 292, and 293) that are each driven by a read port (281, 282, and 283) that is controlled by an associated word line (261, 262, and 263). Any number of the read ports (281, 282, and 283) may be concurrently accessed during a clock cycle. However, the circuitry in the integrated circuit that uses using the multi-port memory cell 200 should ensure that only one of the write ports (231, 232, or 233) is used for each row during each clock cycle to ensure that valid data is written into the multi-port memory cell 200.

When digital integrated circuit designer needs a multi-port memory, that digital integrated circuit designer does not have many different design options. Standard two-port memory systems are generally available to digital integrated circuit designers but anything beyond a two-port memory (such as a three-port memory or four-port memory) requires different solution. Thus, when designing a digital integrated circuit that requires memory with more memory ports than available on a two-port memory system, the digital integrated circuit designer has few options. In most cases the digital integrated circuit designer will only be able to choose between two very different design options: designing a custom multi-port memory array for use in the digital integrated circuit or using logic synthesis tools to create synthesized multi-port memory circuits as needed for the digital integrated circuit.

Custom Design of Multi-Port Memory Systems

For high-volume and high-performance integrated circuits that need multi-port memory systems, a digital integrated circuit designer will typically choose to design a custom multi-port memory array for the integrated circuit. For example, when designing a high-volume processor system that will be used in millions of digital electronic products, a digital integrated circuit designer will typically decide to create a custom multi-port memory array for that processor system since a custom designed multi-port memory array will provide the best performance and the smallest integrated circuit area usage. All of the different circuit entities on the integrated circuit that need access to multi-port memory locations will direct their memory access requests (reads and writes) to the custom-designed multi-port memory array. The floor-planning, placement, and routing tools used to design the integrated circuit will therefore place the custom-designed multi-port memory array in an optimized location that allows all the circuit entities that use the multi-port memory to be routed to the custom-designed multi-port memory array.

The circuitry design and specific circuit geometry of a custom multi-port memory array may be optimized to provide the best circuit area usage, timing, and power consumption metrics for the specific integrated circuit being designed. For example, if an integrated circuit designer is working on an integrated circuit for mobile applications, the integrated circuit designer may design the custom multi-port memory array in a manner that trades off some latency performance in order to obtain reduced power consumption and thereby extend the battery life for the mobile device. Conversely, an integrated circuit designer that is designing a multi-port memory array for a very high-performance processor system may choose to sacrifice energy efficiency and integrated circuit die area savings in order to obtain the best performance speed possible.

Designing custom multi-port memory systems will generally provide the best results in terms of minimizing layout area, speed performance, and minimizing power consumption. However, obtaining these optimized results may come at a significant cost in terms of both money and time.

Designing a custom multi-port memory array typically requires assigning engineering team members to the specific task of designing the multi-port memory system for the integrated circuit project thus raising the engineering budget for the project. Furthermore, the engineers assigned to design the multi-port memory array will require the expensive integrated circuit design tools needed to design a custom multi-port memory array.

After obtaining the needed tools, the engineers designing a custom multi-port memory system will generally need some time to design their custom multi-port memory system. If the custom multi-port memory array that is designed is a completely new circuit design, that new custom multi-port memory array will need to be thoroughly tested and validated with test fabrications before being put into a final integrated circuit product. All of these designing, silicon validation, and testing steps for the custom multi-port memory array will require a significant amount of time thus lengthening the design cycle of the integrated circuit. Thus, although a custom multi-port memory design will generally achieve the best results, the cost and risk of attempting custom multi-port memory design will be high.

Synthesized Design of Multi-Port Memory Systems

Although custom designed multi-port memory arrays will generally yield the best results in terms of performance metrics (circuit area size, power consumption, operation speed, etc.), not every digital integrated circuit project has the time or the budget to design a custom multi-port memory array to provide multi-port memory services. If a digital integrated circuit product needs to be brought to market quickly and/or the design budget is not large enough to pay for a custom-designed multi-port memory array then a digital integrated circuit designers must instead use logic synthesis tools to construct multi-port memories as needed.

For example, an Application Specific Integrated Circuit (ASIC) may be required for a specialized electronic product that will not be manufactured in very large volumes. Due to the limited manufacturing volume, it is not likely that there will be a design budget large enough to pay for the design and testing of a custom multi-port memory array. Instead, the ASIC designers will rely upon logic synthesis tools to synthesize multi-port memory devices as needed to implement the ASIC design. The logic synthesis tools will create multi-port memory in an ad hoc manner such that the various multi-port memory cells will be scattered around the integrated circuit layout as determined by placement and routing tools.

Using synthesized multi-port memory greatly simplifies the integrated circuit design process such that there is very little engineering effort expended on creating the multi-port memory system. For example, an ASIC designer may simply write register transfer level (RTL) code in a hardware design language (HDL) that functionally describes the operation of the desired digital integrated circuit. The HDL code written by the ASIC designer may include multiple requests to read data from a single register in a single clock cycle such that a multi-port memory will be required to implement that register in order to handle all of the concurrent read operations in a single clock cycle.

After writing register transfer level HDL code that describes the function of the desired ASIC, a logic synthesis tool processes the ASIC designer's register transfer level code and synthesizes the needed digital circuitry to implement the described functions. Specifically, the logic synthesis tool selects circuit cells from a standard library of commonly-used circuit elements. Typical circuit elements in a standard library include logical AND gates, logical OR gates, flip-flops, buffers, latches, inverters, logical NOR gates, and many other commonly used circuit elements. The logic synthesis tool combines the standard library circuit cells in a manner to achieve the functionality described within the ASIC designer's HDL code. In the standard circuit library, the two main memory elements (circuits that provide the ability to store a data bit) are the flip-flop circuit and the latch circuit. Thus, the logic synthesis tools create multi-port memories within the ASIC using flip-flop and latch circuits.

Creating multi-port memory systems with synthesis tools is a very fast and easy way for an ASIC designer to created needed multi-port memories within an ASIC. All that is required is properly drafted register transfer level HDL code and access to the appropriate logic synthesis tools. Using logic synthesis tools allow an integrated circuit designer to implement the needed multi-port memories for an ASIC within a matter of days. And since the resulting multi-port memory circuits constructed by the logic synthesis tool is created from standard library circuit elements, no extensive validation and testing will be required to use the synthesized multi-port memory. However, all of this convenience comes at a cost. The multi-port memory systems created by logic synthesis tools tend to be very inefficient on a number of different metrics.

As set forth above, the two main memory elements in most standard circuit libraries are the flip-flop circuit and latch circuit. In order to use these two standard memory element circuits within a multi-port memory system, the logic synthesis software tool combines these standard memory circuit elements with additional standard circuit elements (such as logic gates) to create read ports and write ports to create a synthesized multi-port memory system.

Figure 3:
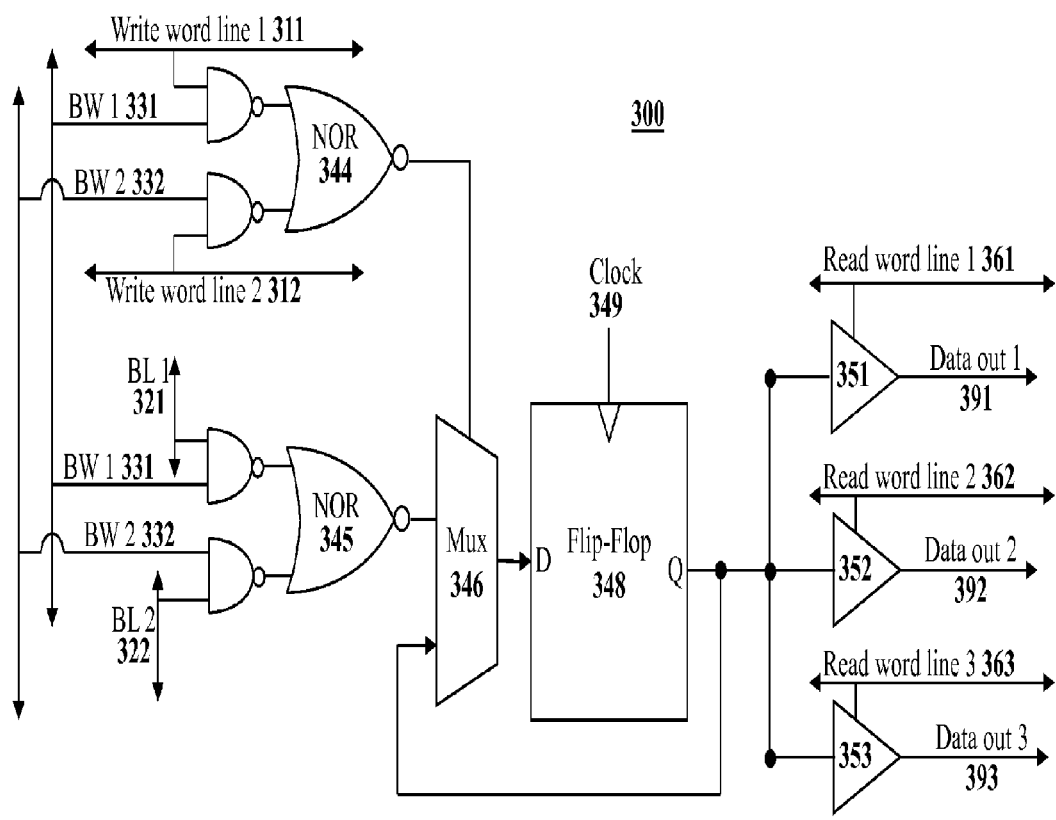
FIG. 3 illustrates a first example of a multi-port memory bit circuit that may be created by a logic synthesis tool.

FIG. 3 illustrates a first example of a multi-port memory bit circuit 300 that may be created by a logic synthesis tool. The multi-port memory bit circuit 300 of FIG. 3 is a two-write-port and three-read-port memory cell. A collection of logic gates (NAND gates and NOR gates) and a multiplexor 346 are used to implement a pair of write-ports into a memory element. In the example of multi-port memory bit circuit 300 of FIG. 3, a flip-flop circuit 348 is used as the memory element for storing the value of a data bit. A set of three buffer circuits (351, 352, and 353) are used to implement three read ports. Note that the flip-flop circuit 348 is illustrated in block diagram form but is actually constructed with numerous simpler logic circuits such as NAND gates and NOR gates. The NAND gates and NOR gates are each constructed from several transistors. The entire collection of circuitry illustrated in FIG. 3 is used to store a single bit of data within a multi-port memory bit cell.

Figure 4:
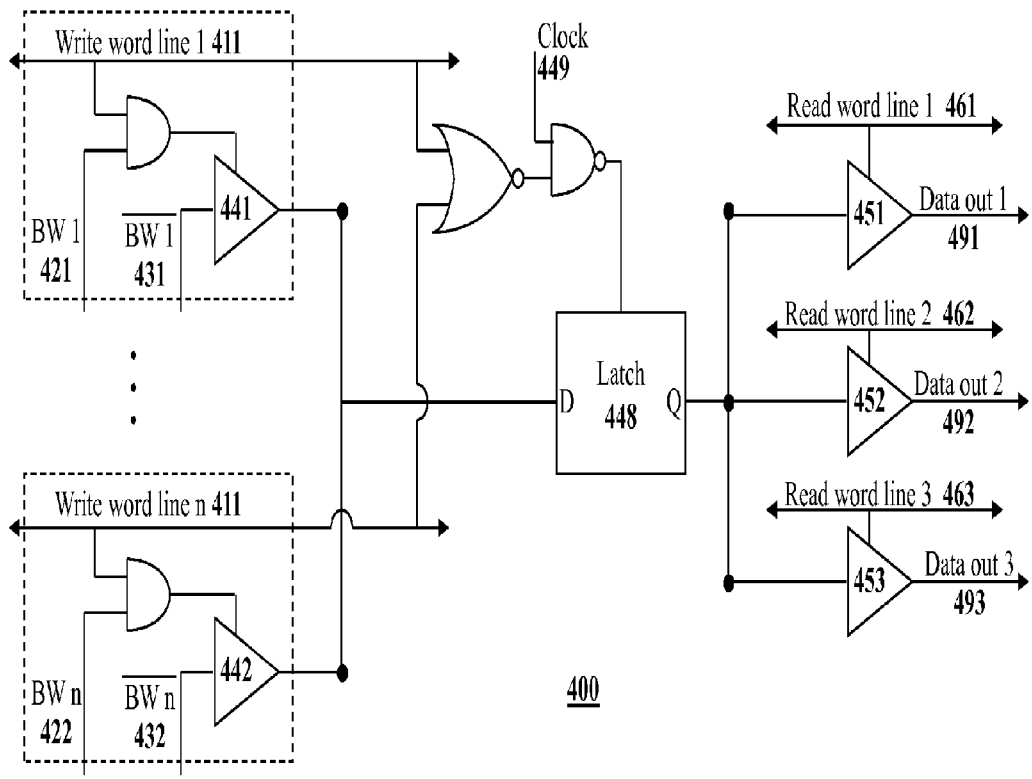
FIG. 4 illustrates a second example of a multi-port memory bit circuit that may be created by a logic synthesis tool.

FIG. 4 illustrates a second example of a multi-port memory bit cell 400 that may be created by a logic synthesis tool. The multi-port memory bit circuit 400 is an n-write-port and three-read-port memory cell. A logical AND gate and a buffer are used to implement each of the n write-ports into a memory element. In the multi-port memory bit circuit 400, a latch circuit 448 is used as the memory element for storing the value of a data bit. An additional NOR gate and NAND gate are used to connect the write-ports to the latch circuit 448 based memory element. A set of three buffer circuits (451, 452, and 453) are used to implement three read ports. All of the circuitry illustrated in FIG. 4 may be synthesized by a logic synthesis tool in order to store a single bit of data within the synthesized multi-port memory bit cell 400.

The end result from a logic synthesis tool is a multi-port memory bit cell (such as 300 or 400) that uses significantly more die layout-area than the area used for a memory bit cell in a custom designed multi-port memory cell array. In fact, on pretty much every performance metric used the synthesized multi-port bit cell will be worse than a custom designed multi-port bit cell. For example, a synthesized multi-port bit cell will generally consume more power than a custom multi-port bit cell, a synthesized multi-port bit cell will use more layout area than a custom multi-port bit cell, and a synthesized multi-port bit cell will operate slower than a custom multi-port bit cell. Thus, although the use of logic synthesis tools significantly simplifies the task of creating multi-port memory for use within a digital integrated circuit, the synthesized multi-port memory will generally provide worse performance for all of the metrics used to rate multi-port memory bit cells.

Overview of an Intermediate Multi-Port Memory System Solution

There is a significant gulf between the efficient but very expensive custom multi-port memory array solution and the inefficient but quick-to-design synthesized multi-port memory solution. Thus, it would be desirable if there were an intermediate solution that could provide an efficient multi-port memory solution without the significant monetary costs, risks, and long design times required to create a custom-designed multi-port memory solution. The present disclosure provides a solution to this problem by introducing efficient multi-port memory arrays constructed from standard circuit components. The created multi-port memory arrays can easily be integrated into integrated circuit designs using standard integrated circuit design tools.

As set forth earlier, integrated circuit designers that required multi-port memory functionality traditionally had a stark choice between either designing a custom multi-port memory array or using logic synthesis tools to (inefficiently) synthesize multi-port memory cells as required. The present disclosure introduces an intermediate solution wherein design parameters for a desired multi-port memory array may be provided to an automated multi-port memory design system. The automated memory design system then proceeds to create a physical multi-port memory array and the required support circuitry for accessing the multi-port memory array.

A multi-port memory system constructed according to the teachings of the present disclosure may comprise two distinct parts: a multi-port memory circuit array and additional memory control circuitry that accesses the multi-port memory array in response to requests. The multi-port memory array may comprise a physical circuit design that is created from an array of individual multi-port memory cells.

The memory control circuitry may comprise a collection of register transfer level (RTL) code that has been written in a hardware design language (HDL). When processed with a logic synthesis tool, the memory control circuitry code creates the needed memory control circuits for handling memory read operations and memory write operations into the physical memory array in response to requests from memory users. For example, the memory control circuitry handles latching write data, latching address values, decoding address values, and writing data into (or reading data from) the physical multi-port memory array. A user of the automated multi-port memory design system of the present disclosure integrates the physical multi-port memory array and the memory control circuitry code into their integrated circuit design in order to create an integrated circuit that uses the synthesized multi-port memory array.

A Multi-Port Memory Cell Constructed from Standard Components

Figure 5:
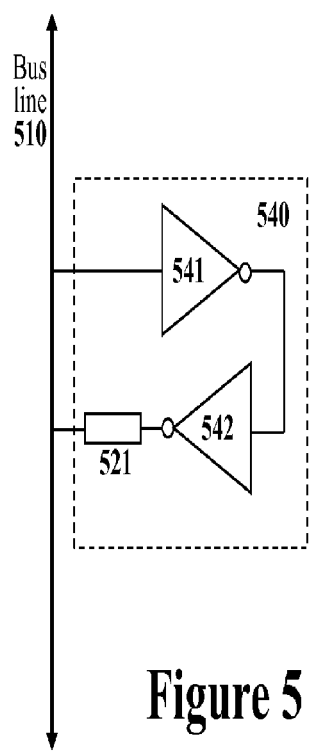
FIG. 5 illustrates a block diagram of a bus keeper circuit.

The two main memory circuit components generally available in a standard circuit library are the flip-flop circuit and the latch circuit. Thus, logic synthesis tools generally use flip-flop or latch circuits when synthesizing multi-port memory cells as required by register transfer level code. However, another commonly available memory circuit within many standard circuit libraries is the bus keeper circuit (or bus holder circuit). FIG. 5 illustrates a block diagram of a typical bus keeper circuit 540. A bus keeper circuit 540 is a weak latch circuit that was specifically designed to hold the last data value placed on to a tri-state bus line 510.

A typical bus keeper circuit 540 is basically a small memory element with the output connected back to the input through a relatively high impedance element 521. The bus keeper circuit 540 is usually implemented with two inverter circuits (541 and 542) connected in a back to back arrangement. The second inverter 542 drives the bus line 510 weakly due to high impedance element 521. Weakly driving the bus line 510 allows the driver circuits that drive the bus line 510 to easily override the current data value that the bus keeper circuit 540 is placing on the bus line 510.

The bus keeper circuit 540 is generally used to prevent CMOS gate inputs from receiving floating values when such gate inputs are connected to tri-stated bus lines. Floating values could potentially turn on both transistors in a gate thus accidentally shorting the power line to ground and thereby destroying the CMOS gate. The bus keeper circuit 540 prevents such an occurrence by pulling the gate input to the last valid logic level (0 or 1) on the bus line 510. Thus, the bus keeper circuit 540 acts as a small memory element that holds a bus line 510 in the same logical state that the last bus driver drove the bus line 510.

In certain embodiments, the present disclosure proposes using a bus keeper circuit 540 as the memory element for a storing a data bit in a multi-port memory cell. A bus keeper circuit 540 is typically a relatively small circuit cell in a standard circuit library. In comparison to a typical latch circuit or flip-flop circuit, the bus keeper circuit 540 is significantly smaller such that using the bus keeper circuit 540 as the memory element in a multi-port memory cell instead of a latch circuit or flip-flop circuit will reduce the size of the multi-port memory cell. Not every standard circuit library includes a bus keeper circuit such that for circuit libraries that do not include a bus keeper circuit then a bus keeper circuit will need to be designed, tested, and validated.

In addition to the core memory element that stores a data bit, a multiport memory cell also requires write ports to allow writing circuits to write a data bit into the memory element and read ports to allow reader circuits to read the data bit stored in the memory element. In one embodiment, the present disclosure may use standard tri-state buffer circuits to serve as write ports and read ports for a multi-port memory bit cell.

Figure 6:
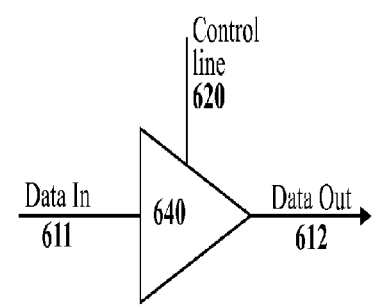
FIG. 6 illustrates a block diagram of a tri-state buffer circuit.

FIG. 6 illustrates a block diagram view of a tri-state buffer circuit 640. The tri-state buffer circuit 640 passes data on the data in line 611 to the data out line 612 only when the control line 620 is activated. When control line 620 is not activated, the tri-state buffer circuit 640 allows the data out line 612 to assume a high impedance state effectively removing the output of the tri-state buffer circuit 640 from the circuit. This allows multiple driver circuits to share the same data out line 612 without conflicting with each other.

FIG. 7A illustrates a first embodiment of a multi-port memory cell that may be created using a standard bus keeper circuit 740 as the core memory element. The particular multi-port memory cell illustrated in FIG. 7A has three separate write ports and three separate read ports. Each write port consists of a tri-state buffer (731, 732, and 733) controlled by an associated write word line (711, 712, and 713). The three write port tri-state buffers (731, 732, and 733) are all coupled to a common data write line 739 used to drive a data bit into the bus keeper circuit 740. Any of the three write ports can write data into the bus keeper circuit 740 by activating the associated word line such that a data bit driven on the input data line (721, 722, or 723) passes through the tri-state buffer (731, 732, or 733) to the bus keeper circuit 740 to overwrite the current data bit stored in the bus keeper circuit 740.

The bus keeper circuit 740 maintains the data bit written into it by one of the tri-state buffer based write ports. FIG. 7B illustrates another embodiment wherein the data stored in the bus keeper circuit 740 is read from the between the back-to-back transistors 741 and 742. Furthermore, the embodiment of FIG. 7B is supplemented with a simple buffer circuit 747 to help drive the data output. Whether or not an additional buffer circuit 747 is required may depend on the number of output lines that the memory cell (bus keeper circuit 740) may need to drive concurrently.

The read ports of the multi-port memory cell may also be implemented with tri-state buffer circuits. In FIGS. 7A and 7B there are three different read ports wherein each read port is implemented with a tri-state buffer (781, 782, and 783) controlled by an associated read word line (761, 762, and 763). All three read ports are coupled to a common data read line 749 that is coupled to the memory element 740. In the embodiments of FIGS. 7A and 7B, all three read ports may be activated provided that memory element circuit 740 (or buffer circuit 747 as in the embodiment of FIG. 7B) is large enough to drive all three data output lines (791, 792, and 793) simultaneously.

Figure 7C:
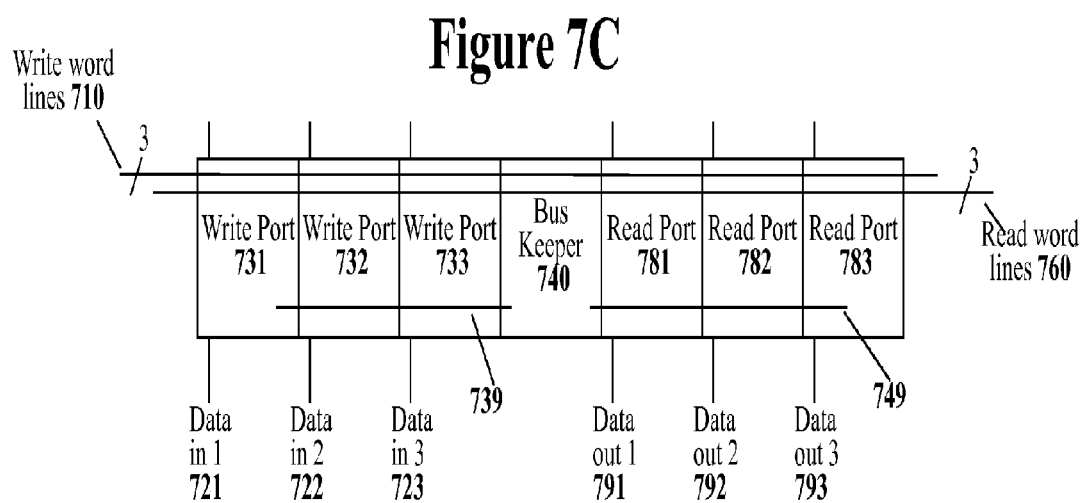
FIG. 7C illustrates an example integrated circuit standard cell layout of the multi-port memory circuit illustrated in FIG. 7A.

FIGS. 7A and 7B present circuit diagram views of example multi-port memory cells that may be created. However, an actual physical multi-port memory cell will typically be laid out using the standard cell system using fixed-height circuit cells that are laid out in a common row. FIG. 7C conceptually illustrates an example of a possible layout of the multi-port memory cell of FIG. 7A in standard cell form.

As illustrated in FIG. 7C three write port cells (731, 732, and 733) are lined-up in a single fixed-height circuit row and coupled to bus keeper memory element 740. The three write port cells (731, 732, and 733) are controlled with a set of three write word lines 710 that may be shared by all of the memory cells that occupy the same row in a memory array. In the example of FIG. 7B, the three write port cells (731, 732, and 733) are coupled to the memory element 740 with a common data write line 739 used to write a data value into the memory element 740. In other embodiments, individual data lines may be used. Each of the three write port cells (731, 732, and 733) receives data from an associated data input line (721, 722, and 723) that is shared by different memory bit cells in the same column of the memory array. In addition, each of the three write port cells (731, 732, and 733) may also receive a vertically aligned individual bit write (BW) line (not shown) that controls whether a write operation affects this particular column of the memory array.

At the center of the multi-port memory bit cell of FIG. 7C is a memory element 740 that may be constructed with a standard bus keeper (or bus holder) circuit. As set forth with reference to FIG. 5, the bus keeper circuit is a standard memory cell that is available in many integrated circuit standard circuit libraries. However, other types of memory element circuits other than bus keeper circuits may be used in other implementations. Furthermore, if a bus keeper circuit is not available in a particular integrated circuit library then such a bus keep circuit (or a similar circuit) may be designed, tested, and validated for that particular integrated circuit library such that it will be available for use in all future circuits.

The memory element 740 of FIG. 7C is coupled to three read port cells (781, 782, and 783) implemented in the same fixed-height circuit cell row. The three read port cells (781, 782, and 783) are controlled with a set of three read word lines 760 that are shared by all of the memory cells that occupy the same row in a memory array. The memory element 740 may be coupled to the read port cells with a common data read line 749 or with individual data lines. Each of the three read port cells (781, 782, and 783) outputs data on an associated data output line (791, 792, and 793). In some embodiments, each of the three read port cells (781, 782, and 783) may also receive an individual bit read line (not shown) that controls whether a read operation affects this particular column of the memory array. The read port cells (781, 782, and 783) may all be activated concurrently.

The multi-port memory cell illustrated in FIGS. 7A, 7B and 7C illustrate only some possible implementations of memory bit cells for only one specific port arrangement (three write ports and three read ports). Other multi-port memory cells may use different memory element circuits, other write port circuits, and/or other read port circuits. And any different permutation of read ports and write ports may be created as long as the circuits are strong enough to drive all of the signals within the timing allotments.

One of the most powerful aspects of the multi-port memory bit cells illustrated in FIGS. 7A, 7B and 7C is that the multi-port memory bit cells are created with standard cell circuits that are commonly available in many integrated circuit libraries. If a particular circuit cell is not available in a particular circuit cell library, then that circuit cell may be designed, tested, and validated such it is available for all future memory bit cell designs. Provided all of the individual circuit cells have been validated, many different memory bit cells can easily be created by combining together the individual circuit cells needed for a particular application. Thus, using the teachings described in this document, it is relatively easy to create the multi-port memory bit cells of FIGS. 7A, 7B and 7C (and many other variations) with commonly available electronic design tools.

In some embodiments, the individual standard circuit cells may be modified to a small degree in order to optimize the size or structure of the multi-port memory bit cells. For example, the location of where various data or control signals enter a circuit cell may be moved to a different location to improve the circuit cell's usage within an array. Additional permutations of the same circuit cells may be created with slightly different characteristics. Such modified circuit cells must each be tested and fully validated before being used to create multi-port memory arrays.

A Multi-Port Memory Array Constructed from Multi-Port Memory Cells

To build multi-port memory systems, individual multi-port memory bit cells (such as the examples illustrated in FIGS. 7A, 7B and 7C) may be arranged into a two-dimensional grid pattern to form a multi-port memory array. For example, FIG. 8A illustrates the fixed-height cell row view of an example multi-port memory cell having three write ports (811, 812, and 813) and three read ports (861, 862, and 863) created according to the teachings of this disclosure. Many instances of the multi-port memory cell of FIG. 8A may be arranged into a two-dimensional multi-port memory array 800 as conceptually illustrated in FIG. 8B. The individual multi-port memory bit cells within the two-dimensional multi-port memory array 800 of FIG. 8B may be individually accessed using the horizontal and vertical signal lines that enter into the multi-port memory array 800.

For example, the multi-port memory array 800 may be constructed using array of the multi-port memory bit cell illustrated in FIG. 7C. To access a specific multi-port memory bit cell in the multi-port memory array 800 for a write operation, one of the horizontal write word lines 710 is asserted for a specified row and write circuitry 859 drives data onto an associated vertical data input bit line (721, 722, or 723) for a specified column to write data into the memory bit cell. Note that an individual bit write signal line (not shown) may also need to be asserted for memory system implementations that use bit write lines to select individual columns of the multi-port memory array 800.

Read operations from the multi-port memory array 800 may be handled in a similar manner. Specifically, to read data from a specific multi-port memory bit cell in the multi-port memory array 800, addressing circuitry asserts one of the horizontal read word lines 760 for an addressed row. Simultaneously, data read circuitry 859 coupled to an associated data output bit line (791, 792, or 793) for an addressed column reads the data bit value out of the addressed memory cell.

FIG. 8B illustrates, in block diagram form, some of the support circuitry that must be present to operate the multi-port memory array 800. On the side of the multi-port memory array 800, row buffer circuits 858 need to be able access the rows of the multi-port memory array 800 in order to activate a write word line (for write operations) or read word line(s) (for read operations) for the proper row according the address specified in the write or read operation, respectively. Additional decoder circuitry (not shown) is needed to select the proper row of buffer circuits 858 to activate. At the bottom of the multi-port memory array 800, read and write circuitry 859 needs to be able to drive data for write operations or read data from multi-port memory cells for read operations. Note that read and write circuitry 859 will also need information from the decoder circuitry (not shown) in order to access the proper column of the multi-port memory array 800.

A Multi-Port Memory System Constructed from a Multi-Port Memory Array

Figure 8C:
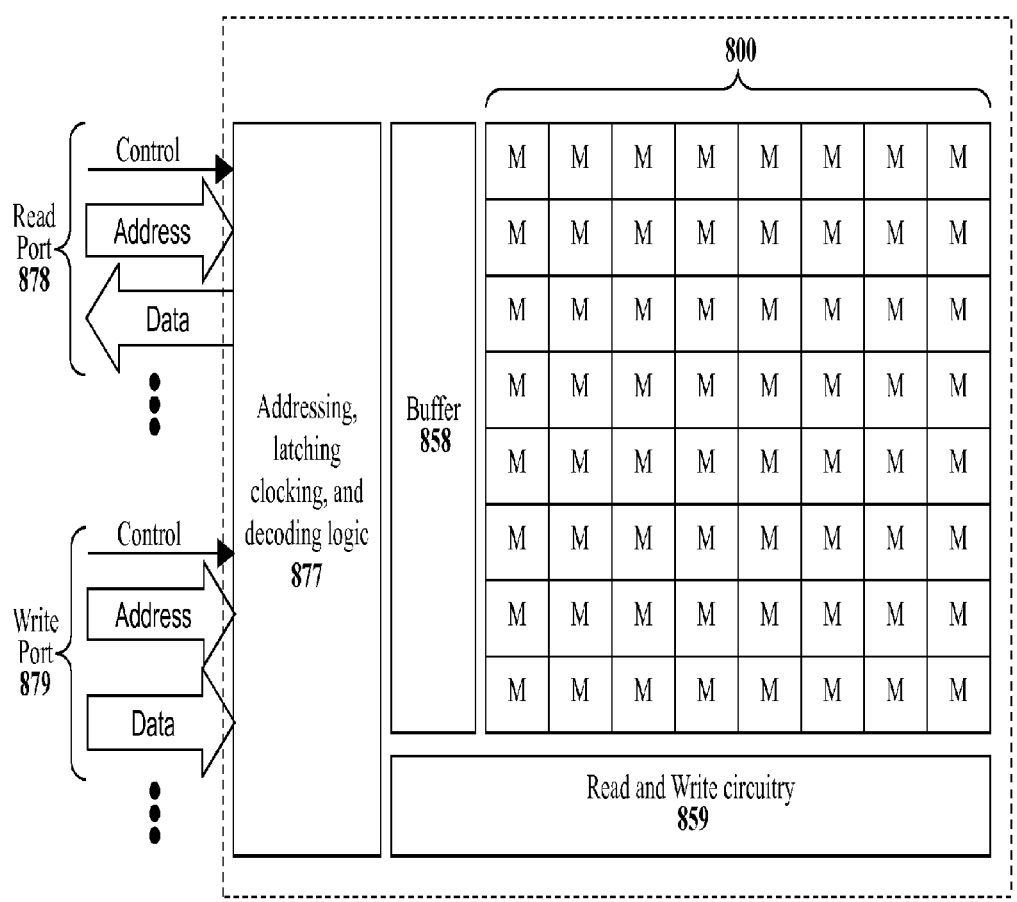
FIG. 8C illustrates an example of a very small multi-port memory system constructed from the multi-port memory array of FIG. 8B.

The multi-port memory array 800 illustrated in FIG. 8B may be used to create a multi-port memory system for use within an integrated circuit. To create a full multi-port memory system, the multi-port memory array 800 needs to be supplemented with a small amount of memory control circuitry that interfaces between the users of the multi-port memory system and the multi-port memory array 800. FIG. 8C illustrates an example of a small multi-port memory system constructed from the multi-port memory array 800 of FIG. 8B. The small multi-port memory system of FIG. 8C includes memory control circuitry 877 that handles interactions from multiple read ports 878 and write ports 879. Specifically, the control circuitry 877 may handle addressing, latching, clocking, address decoding, and other tasks for the multi-port memory system of FIG. 8C.

Figure 9A:
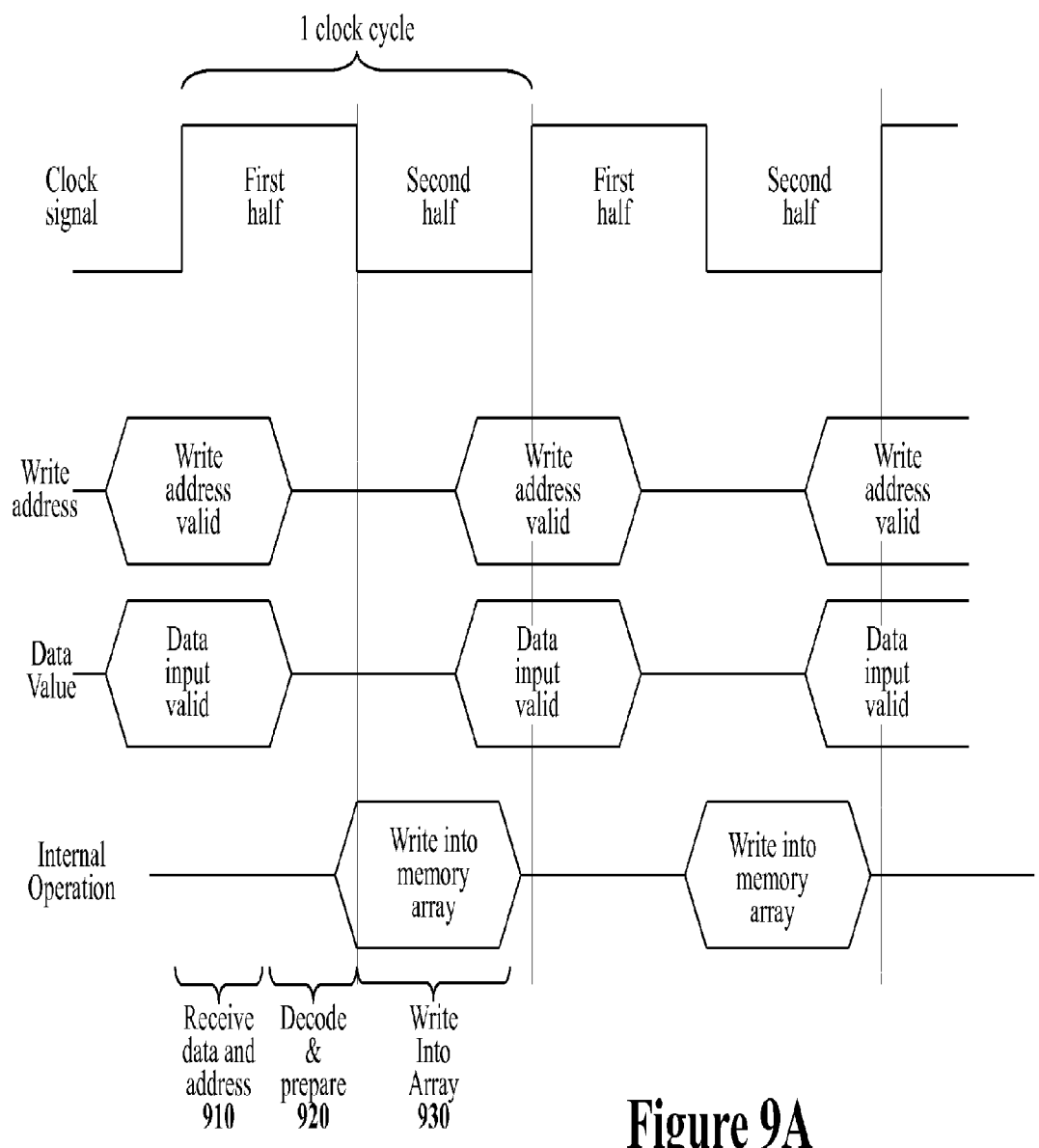
FIG. 9A illustrates a timing diagram describing how the multi-port memory control circuitry may handle a write operation in one embodiment.

The control circuitry 877 of FIG. 8C responds to requests on write ports 879 by writing the requested data into the proper location of the multi-port memory array 800. FIG. 9A illustrates an example timing diagram describing how the how the control circuitry 877 may handle memory write operations in one particular embodiment. Initially, the control circuitry 877 latches address values and data values during the first half of a memory cycle at stage 910. The control circuitry 877 then decodes the received write address to activate the proper rows and columns in the multi-port memory array 800 at stage 920. Next, at stage 930 in the second half of the memory cycle, the control circuitry 877 drives the write port tri-state buffers to write the data values into the proper locations within the multi-port memory array 800.

Figure 9B:
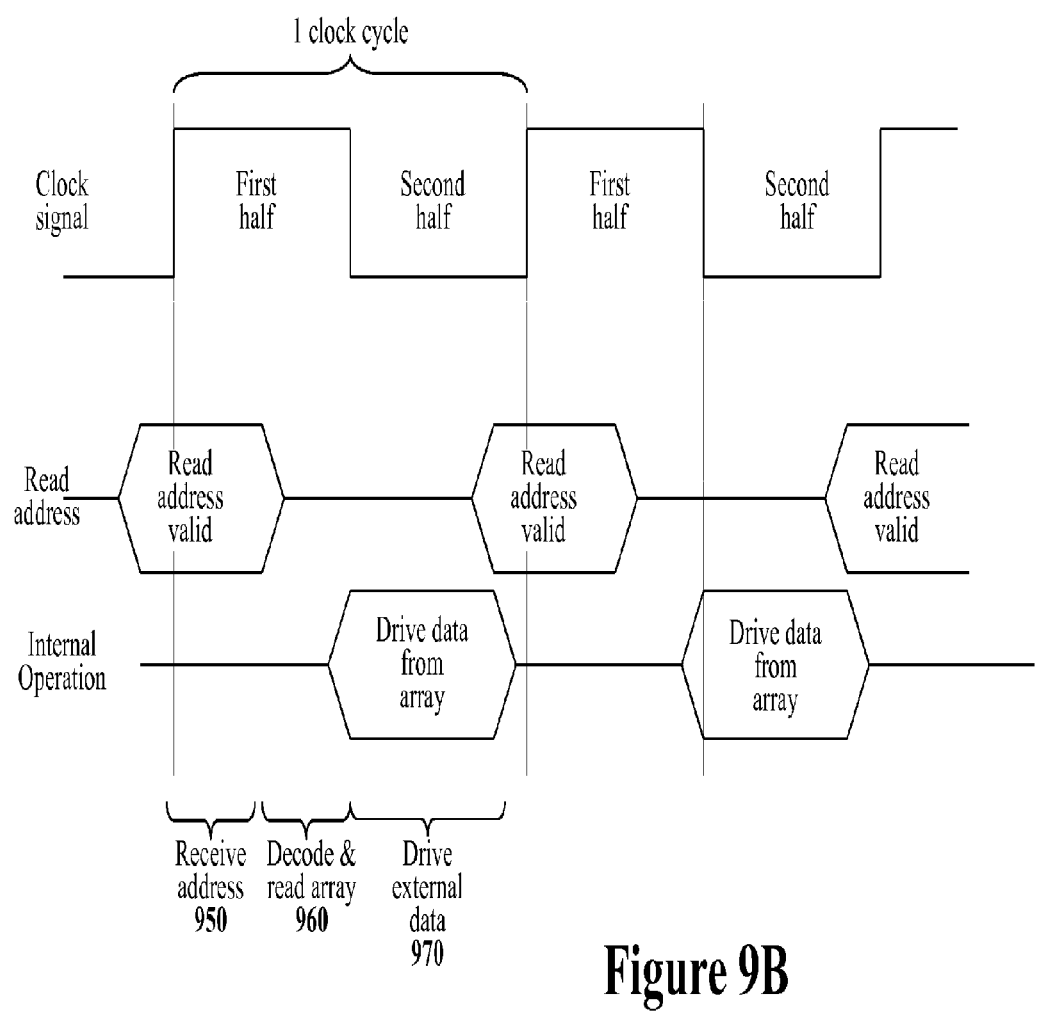
FIG. 9B illustrates a timing diagram describing how the multi-port memory control circuitry may handle a read operation in one embodiment.

The control circuitry 877 of FIG. 8C responds to read requests received on read ports 878 by reading data out of the multi-port memory array 800 and serving the data to the requestor. FIG. 9B illustrates one example of a timing diagram that describes how the control circuitry 877 may handle read operations in one particular embodiment. Initially, during stage 950, the control circuitry 877 latches the read address value early in the first half of a memory cycle. The control circuitry 877 then decodes the read address value to activate the proper rows and columns in the multi-port memory array 800 at stage 960. Finally, at stage 970 in the second half of the memory cycle, the control circuitry 877 drives multiplexors and tri-state buffers to output the data read from the multi-port memory array 800 to the read requestor.

Given a well-defined multi-port memory array 800 (well-defined in terms of physical layout and timing specifications), all of the control circuitry 877 needed to implement a multi-port memory system that uses memory array 800 may be created with register transfer level (RTL) code written in a hardware design language (HDL). The memory control circuitry code is processed with a logic synthesis tool to generate the physical control circuitry 877. Thus, to implement the small multi-port memory system of FIG. 8C within an integrated circuit, an integrated circuit designer only needs the detailed specification of a physical multi-port memory array 800 and the accompanying RTL code needed to implement the control circuitry 877. The integrated circuit designer integrates the RTL code for the control circuitry 877 with the other RTL for the integrated circuit and provides the detailed physical and timing specification of the multi-port memory array 800 with the place and route software being used for the integrated circuit.

Multi-Port Memory System Constructed from Multiple Multi-Port Memory Arrays

For very small multi-port memory systems, a single multi-port memory array 800 may be used as illustrated in the embodiment of FIG. 8C. However, for larger multi-port memory systems a single multi-port memory array will not suffice. When a multi-port memory array is increased in size, the data bit lines and the word lines within the multi-port memory array will become longer and thus have increased capacitance and resistance. Therefore, the existing driver circuits for those lines will eventually not be able to adequately drive the longer lines. To handle larger multi-port memory arrays, the driver circuits will need to become larger, the timing periods will become longer, or both. Since some of the line drivers are within the memory cells (such as the output buffers of the read ports), the actual memory cell size would need to increase and thus reduce memory density.

Instead of increasing the sizes of driver circuits (and thus reduce memory density) or extending timing periods (thus reducing performance), parallelism may be employed to increase the size of a memory system. Specifically, instead of creating a single large multi-port memory array, a large multi-port memory system may be implemented by combining multiple parallel multi-port memory arrays in a single memory system.

Figure 10A:
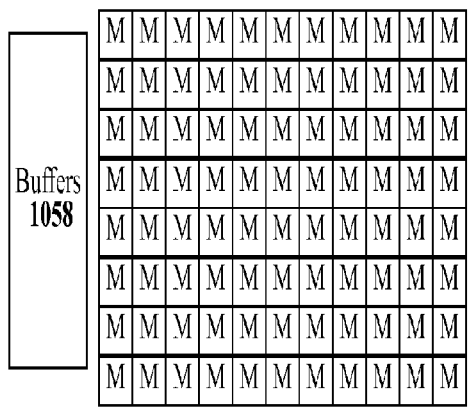
FIG. 10A illustrates a block diagram of a multi-port memory array.

FIG. 10A illustrates a single multi-port memory array constructed from independent multi-port memory bit cells (such as the bit cell of FIG. 7C). The multi-port memory array of FIG. 10A includes the row buffers 1058 to drive the horizontal word lines of the memory array. The multi-port memory array of FIG. 10A also includes the read and write circuitry 1059 located outside of the array to read data from the array and write data into the array. Note that FIG. 10A provides just one example, other memory array examples may include additional external circuitry or include less external circuitry. To form a large multi-port memory system, several instances of the individual multi-port memory array of FIG. 10A may be combined as illustrated in FIG. 10B.

Figure 10B:
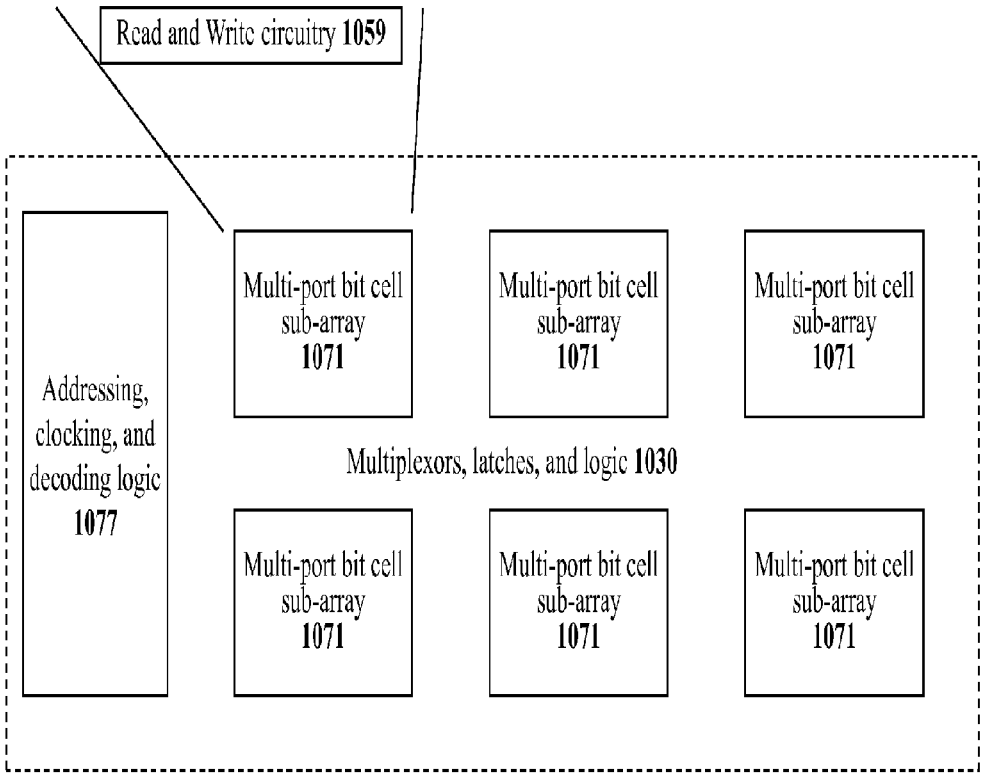
FIG. 10B illustrates a multi-port memory system constructed using several instances of the multi-port memory array of FIG. 10A.

FIG. 10B illustrates a multi-port memory system that is made up of an addressing, clock, and decoding logic block 1077, several multi-port bit cell sub-arrays 1071, and the necessary multiplexors, latches, and logic 1030 needed to combine the multiple multi-port bit cell sub-arrays 1071. The addressing, clock, and decoding logic block 1077 is the memory system control logic that interfaces between memory users and the collection of multi-port bit cell sub-arrays 1071. The control logic 1077 use the multiplexors, latches, and logic 1030 to direct the signals from the read operations and write operations to the proper multi-port bit cell sub-array(s) 1071 as required.

The control logic 1077 and the multiplexors, latches, and logic 1030 may all be created synthetically from parameterized register transfer level (RTL) code. Specifically, a set of parameters that define the size of the full multi-port memory system and the size of the individual multi-port bit cell sub-arrays 1071 that will be used to construct logic needed to implement the full multi-port memory system. These parameters are provided to parameterized register transfer level code to create a specific instance of register transfer level code for a specific multi-port memory system. That instance of register transfer level code and the physical specification for the multi-port bit cell sub-arrays 1071 is then used to build the final multi-port memory system.

Multi-Port Memory Design System

As set forth in the preceding sections, this document discloses a new method for allowing integrated circuit designers to created multi-port memory systems. Specifically, instead of either designing a custom multi-port memory system (an expensive and risky solution) or allowing logic synthesis tools to create ad hoc multi-port memory instances as needed (an inefficient solution), the present disclosure allows integrated circuit designers to easily create multi-port memory systems by using traditional standard circuit cells and register transfer level (RTL) hardware design language code. To simplify the task of creating specific multi-port memory systems, a multi-port memory design system has been created that automates the process of designing such multi-port memory systems.

Figure 11:
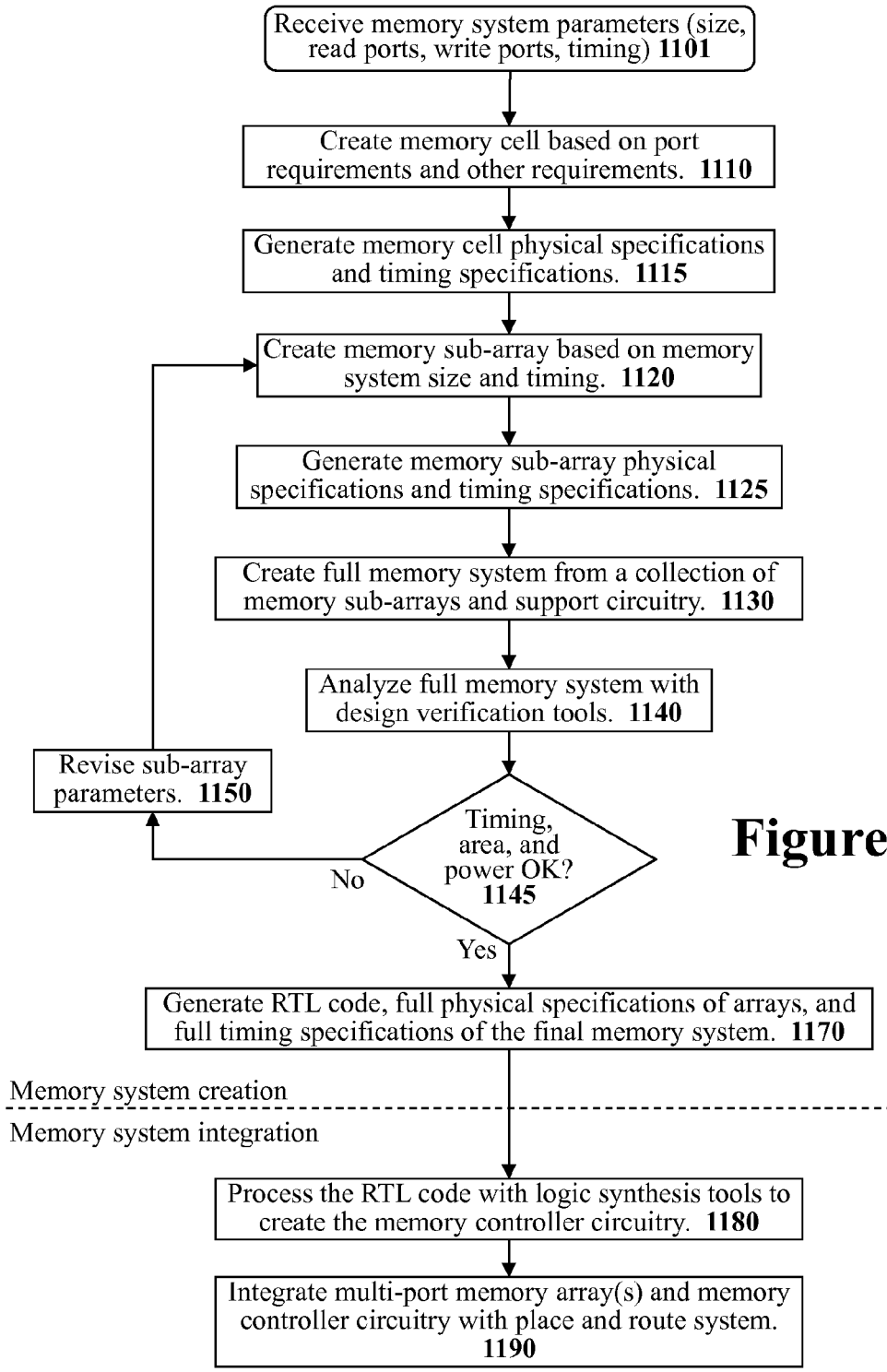
FIG. 11 illustrates a flow diagram describing how a multi-port memory design system may be used to create multi-port memory systems.

The multi-port memory design system is intended to facilitate the creation of a multi-port memory array for use within an integrated circuit that is being designed. FIG. 11 illustrates a flow diagram describing how one embodiment of the multi-port memory design system may operate.

Initially, at stage 1101, an integrated circuit designer provides a set of functional parameters describing a multi-port memory system that is desired for use within an integrated circuit being designed. The functional parameters may include (but are not limited to) the word size of the desired multi-port memory system, the total number of addressable data words, the number of write ports, the number of read ports, and the timing requirements for the multi-port memory system. These functional parameters specifically describe what the integrated circuit designer needs from the desired multi-port memory system.

After receiving the functional parameters that fully describe the desired multi-port memory system, the multi-port memory design system begins by creating a multi-port memory bit cell that fulfils a subset of the functional parameters at stage 1110. Specifically, the multi-port memory design system creates a memory bit cell circuit that fulfils the specified port requirements by including the requested number of write ports and read ports. As set forth with reference to FIGS. 7A, 7B and 7C, the multi-port memory design system will create a multi-port memory bit cell from a set of write-port circuit cells, a memory element cell 740 (such a bus keeper circuit), and a set of read-port circuit cells. The specific number of write-port circuit cells and read-port circuit cells will depend upon the functional parameters provided by the integrated circuit designer. The multi-port memory bit cell circuit created by the multi-port memory design system will form the fundamental memory bit circuit of the memory system being created.

Note that although the port requirements are a key aspect in creating the multi-port memory bit cell at stage 1110, many other requirements may also be taken into consideration. For example, the size of the anticipated memory array may determine whether a buffer 747 is included within the multi-port memory bit cell. Various different circuit cell permutations may be selected depending on other factors such as the process technology being used, the reliability requirements, the timing requirements, etc.

After creating fundamental memory bit cell circuit, the multi-port memory design system then generates a full set of physical, electrical, and timing specifications for the created fundamental memory bit cell circuit at stage 1115. The physical specifications are derived from the various different circuit cells that are combined together to create the fundamental memory bit cell circuit. The electrical and timing specifications may be created by modelling the created fundamental memory bit cell with circuit simulation software. Note that the specifications for various memory bit cell designs may be pre-computed such that this information is merely retrieved from a table or database. The full set of specifications for the fundamental memory bit cell allow the created fundamental memory bit cell circuit to be used within a standard circuit library. For example, a full set of specifications may be created that allows the memory bit cell circuit to be used within the Synopsys suite of electronic design automation (EDA) tools.

Next, at stage 1120, the multi-port memory design system creates a multi-port memory sub-array using the fundamental memory bit cell circuit created at stage 1110. The size and shape of the multi-port memory sub-array will be based upon the functional parameters for the desired multi-port memory system. Specifically, the word size of the desired multi-port memory system, the total number of addressable data words, and the specified timing requirements will guide how large of a multi-port memory cell array should be created. The created multi-port memory cell array may include the additional circuit elements as illustrated in FIG. 8B.

Note that many different permutations of multi-port memory cell arrays may be tested. When a very small multi-port memory system has been requested then single multi-port memory cell array may suffice to create small multi-port memory system. However, multiple small memory arrays may need to be combined together to create the requested multi-port memory system since a single large memory array may not be able to meet the desired timing requirements due to long conductor lines. For example, a system may be created with a small number of large multi-port memory cell arrays or a larger number of small multi-port memory cell arrays. Furthermore, more than a single multi-port memory array size may be designed if necessary. For example, an odd sized memory system may be constructed with several instances of a first size of multi-port memory array (to create most of the memory system) and an additional smaller multi-port memory array for remainder of memory system.

After creating a multi-port memory array (or more than one array) during stage 1120, the multi-port memory design system then generates a full set of physical, electrical, and timing specifications for the created multi-port memory array(s) at stage 1125. The physical specifications of the multi-port memory bit cell array(s) may be determined by multiplying the size of the fundamental memory bit cell by the dimension of the created multi-port memory array. Additional area may be added for the row buffer circuits and read/write circuitry.

The electrical and timing specifications for the multi-port memory array may be created by using circuit simulation software to simulate the circuit operations that occur during read operations and write operations within the multi-port memory array. The full set of physical, electrical, and timing specifications for the multi-port memory array define how fast the multi-port memory array can operate and how other circuits connect to the multi-port memory array. Note that not every permutation of read and write from the multi-port memory array must be tested. For example, the various 'corner cases' may be tested and operations that are between the corner cases may be interpolated.

With a full set of physical, electrical, and timing specifications, a created multi-port memory array can be integrated into the design of an integrated circuit. However, the created multi-port memory array is just the raw data storage circuitry. Additional control circuitry is required to integrate the multi-port memory array with other circuits that will use the multi-port memory array.

Next, at stage 1130, the multi-port memory design system may create a full multi-port memory system by combining the designed multi-port memory array(s) with all of the memory controller support circuitry required to operate the multi-port memory array(s). In one embodiment, the support circuitry for the full multi-port memory system may be created by starting with parameterized register transfer level (RTL) code and then providing a set of specific parameters for the multi-port memory system currently being created. The parameters may be drawn from the functional parameters of the requested multi-port memory system and the full set of specifications describing the multi-port memory bit cell and multi-port memory array created in the previous steps.

Combining the parameterized support circuitry register transfer level code with a specific set of parameters associated with a multi-port memory system being created outputs a specific instance of register transfer level code for the multi-port memory system. The register transfer level code may then be processed with logic synthesis tools in order to create a specific instance of all the memory controller support circuitry needed to control the multi-port memory system. Thus, at the end of stage 1130, the multi-port memory design system has output a multi-port memory array and the RTL code to create the associated memory control support circuitry such that a complete multi-port memory system has been created. FIG. 10B conceptually illustrates an example of a completed multi-port memory system that consists of the control circuitry 1077, six multi-port memory arrays 1071, and the rest of the circuitry 1030 used to couple memory users to the multi-port memory arrays 1071.

The complete multi-port memory system that has been created in the previous stages should be rigorously verified before the multi-port memory system is used within an integrated circuit. Thus, at stage 1140, a complete multi-port memory system circuit is analyzed with a suite of design verification tools. For example, circuit extraction tools may be used to verify that all of the signal paths in the complete multi-port memory system do not have resistance or capacitance issues that cause violations of the specified timing requirements. At stage 1140 the results of the multi-port memory system design verification procedures are examined. If the created multi-port memory system does not meet the required specifications then the multi-port memory design system may need to revise the multi-port memory system to meet the required specifications. The specifications examined may include (but are not limited to) timing specifications, circuit area specifications, and power usage specifications.

If the complete multi-port memory system fails meet the required specifications then revisions may be made to the multi-port memory system design to meet the required specifications. One of the common revisions that may be made is to change the multi-port memory sub-array design. Thus, the multi-port memory design system may revise the parameters of the multi-port memory sub-array at stage 1150. For example, the size of the multi-port memory sub-array may be reduced in order to meet timing requirements. The multi-port memory design system may then repeat stages 1120 through 1145 with the revised multi-port memory system design. Note that other memory system parameters may be modified in order to meet the required specifications. For example, a different fundamental multi-port memory bit cell may be used such the multi-port memory design system may then repeat stages 1110 through 1145 (not shown) to reconstruct and test the revised multi-port memory system.

When a complete multi-port memory system fulfils the required specifications at stage 1145, then the automated multi-port memory design system proceeds to stage 1170 to output a final version of the created multi-port memory system. The multi-port memory design system outputs all of the information required to implement the multi-port memory system within a host integrated circuit. For example, the multi-port memory design system may output the full set of physical, electrical, and timing specifications for the multi-port memory array(s) and the specific instance of register transfer level (RTL) code for implementing the memory control support circuitry. The physical specifications for the multi-port memory array(s) include the physical dimensions of the multi-port memory array and the netlist for all the pins that need to be connected to the memory control support circuitry.

In some embodiments, the automated multi-port memory design system may output multiple multi-port memory systems that each have different characteristics but all meet the required specifications. For example, some designs may use more power than others and some designs may use more area than others. In this manner, a user may select a memory system design that best meets their objectives.

The complete memory system design that is output by the multi-port memory design system at stage 1170 can easily be integrated within an integrated circuit that is being designed. An integrated circuit designer simply merges the completed multi-port memory system design with the rest of an integrated circuit design. Specifically, the set of physical, electrical, and timing specifications for the multi-port memory array(s) is provided to the floor-planning, placement, and routing tools that are being used by the integrated circuit designer. In this manner, those floor-planning, placement, and routing tools can integrate the physical multi-port memory array(s) with the rest of the integrated circuit design. Similarly, the register transfer level code for the memory control support circuitry is provided to the logic synthesis tools that are being used by the integrated circuit designer. A summary of integrating a multi-port memory system is set forth in stages 1180 and 1190.

To integrate a multi-port memory system created by the automated multi-port memory design system, the register transfer level code for the memory control support circuitry is provided to a logic synthesis system at stage 1180. The logic synthesis system may process the register transfer level code for the memory control support circuitry along with other register transfer level code for the integrated circuit being designed. The logic synthesis system will output a netlist of circuit cell connections.

At stage 1190, the set of physical, electrical, and timing specifications for the multi-port memory array circuit is provided to the floor-planning, placement, and routing tools that are being used to design the integrated circuit. The set of physical, electrical, and timing specifications for the multi-port memory array includes a netlist for the multi-port memory array circuit that specifies the interconnections that must be made to the multi-port memory array circuit. The integrated circuit including the created multi-port memory system may then be created by processing all the netlists with place and routing systems.

The preceding technical disclosure is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim is still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72 (b), which requires that it allow the reader to quickly ascertain the nature of the technical disclosure. The abstract is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

We claim:

1. A method of creating a multi-port memory system for an integrated circuit, said method comprising:
   receiving a set of functional specifications for a desired multi-port memory system;
   creating a multi-port memory bit cell circuit based upon said set of functional specifications;
   creating a multi-port memory array circuit from a plurality of said multi-port memory bit cell circuits based upon said set of functional specifications;
   generating an instance of register transfer level code to implement memory controller support circuitry for said desired multi-port memory system; and
   outputting a multi-port memory design comprising said multi-port memory array circuit and said instance of register transfer level code to implement memory controller support circuitry;
   wherein creating a multi-port memory bit cell circuit based upon said set of functional specifications comprises:
      selecting a memory element cell for storing a bit of data;
      coupling outputs from a number of write port cells to said memory element cell, each of said write port cells comprising a tri-state buffer; and
      coupling said memory element cell to inputs of a number of read port cells, each of said read port cells comprising a tri-state buffer.

2. The method of creating a multi-port memory system as set forth in claim 1 wherein:

said number of read port cells is specified as a number of read ports in said functional specifications for said desired multi-port memory system, and said number of write port cells is specified as a number of write ports in said functional specifications for said desired multi-port memory system.

3. The method of creating a multi-port memory system as set forth in claim 1 wherein creating a multi-port memory bit cell circuit based upon said set of functional specifications further comprises:

combining a plurality of circuit cells to create a multi-port memory bit cell circuit design; and processing said multi-port memory bit cell circuit design with a set of electronic design automation tools to create a set of physical and timing specifications for said multi-port memory bit cell circuit design.

4. The method of creating a multi-port memory system as set forth in claim 1 wherein generating register transfer level code to implement memory controller support circuitry comprises providing a set of parameters defining said multi-port memory system and said multi-port memory array circuit to parameterized register transfer level code to generate said instance of register transfer level code to implement memory controller support circuitry.

5. The method of creating a multi-port memory system as set forth in claim 1, said method further comprising:

processing said instance of register transfer level code with a logic synthesis system to create memory controller support circuitry; and processing said memory controller support circuitry and said multi-port memory array circuit with a placement and routing system to implement said multi-port memory system within an integrated circuit design.

6. A computer system comprising:

memory storing instructions;

a processor configured to execute the instructions stored in the memory;

a display coupled to the processor;

wherein the processor executes the instructions stored in the memory to perform a method comprising:

receiving a set of functional specifications for a desired multi-port memory system;

creating a multi-port memory bit cell circuit based upon said set of functional specifications;

creating a multi-port memory array circuit from a plurality of said multi-port memory bit cell circuits based upon said set of functional specifications;

generating an instance of register transfer level code to implement memory controller support circuitry for said desired multi-port memory system; and outputting a multi-port memory design comprising said multi-port memory array circuit and said instance of register transfer level code to implement memory controller support circuitry;

wherein the instructions that cause the processor to create a multi-port memory bit cell circuit based upon said set of functional specifications comprise instructions that cause the processor to:

select a memory element cell for storing a bit of data;

couple outputs from a number of write port cells to said memory element cell, each of said write port cells comprising a tri-state buffer; and couple said memory element cell to inputs of a number of read port cells, each of said read port cells comprising a tri-state buffer.

7. The computer system of claim 6, wherein:

said number of read port cells is specified as a number of read ports in said functional specifications for said desired multi-port memory system; and said number of write port cells is specified as a number of write ports in said functional specifications for said desired multi-port memory system.

8. The computer system of claim 6, wherein the instructions that cause the processor to create a multi-port memory bit cell circuit based upon said set of functional specifications further comprise instructions that cause the processor to:

combine a plurality of circuit cells to create a multi-port memory bit cell circuit design; and process said multi-port memory bit cell circuit design with a set of electronic design automation tools to create a set of physical and timing specifications for said multi-port memory bit cell circuit design.

9. The computer system of claim 6, wherein the instructions that cause the processor to generate register transfer level code to implement memory controller support circuitry comprise instructions that cause the processor to provide a set of parameters defining said multi-port memory system and said multi-port memory array circuit to parameterized register transfer level code to generate said instance of register transfer level code to implement memory controller support circuitry.

10. The computer system of claim 6, further comprising instructions that cause the processor to:

process said instance of register transfer level code with a logic synthesis system to create memory controller support circuitry; and process said memory controller support circuitry and said multi-port memory array circuit with a placement and routing system to implement said multi-port memory system within an integrated circuit design.

11. Non-transitory machine-readable media encoded with instructions that, when executed by a processor, cause the processor to perform operations comprising:

receiving a set of functional specifications for a desired multi-port memory system;

creating a multi-port memory bit cell circuit based upon said set of functional specifications;

creating a multi-port memory array circuit from a plurality of said multi-port memory bit cell circuits based upon said set of functional specifications;

generating an instance of register transfer level code to implement memory controller support circuitry for said desired multi-port memory system; and outputting a multi-port memory design comprising said multi-port memory array circuit and said instance of register transfer level code to implement memory controller support circuitry;

wherein the instructions for creating a multi-port memory bit cell circuit based upon said set of functional specifications comprise instructions for:

selecting a memory element cell for storing a bit of data;

coupling outputs from a number of write port cells to said memory element cell, each of said write port cells comprising a tri-state buffer; and coupling said memory element cell to inputs of a number of read port cells, each of said read port cells comprising a tri-state buffer.

12. The non-transitory machine readable media of claim 11, wherein:

said number of read port cells specified as a number of read ports in said functional specifications for said desired multi-port memory system; and said number of write port cells specified as a number of write ports in said functional specifications for said desired multi-port memory system.

13. The non-transitory machine-readable media of claim 11, wherein the instructions for creating a multi-port memory bit cell circuit based upon said set of functional specifications further comprise instructions for:
combining a plurality of circuit cells to create a multi-port memory bit cell circuit design; and
processing said multi-port memory bit cell circuit design with a set of electronic design automation tools to create a set of physical and timing specifications for said multi-port memory bit cell circuit design.

14. The non-transitory machine-readable media of claim 11, wherein the instructions for generating register transfer level code to implement memory controller support circuitry comprise instructions for providing a set of parameters defining said multi-port memory system and said multi-port memory array circuit to parameterized register transfer level code to generate said instance of register transfer level code to implement memory controller support circuitry.

15. The non-transitory machine-readable media of claim 11, further comprising instructions for:
processing said instance of register transfer level code with a logic synthesis system to create memory controller support circuitry; and
processing said memory controller support circuitry and said multi-port memory array circuit with a placement and routing system to implement said multi-port memory system within an integrated circuit design.

* * * * *